(12) United States Patent
Moriya et al.

(10) Patent No.: US 7,838,916 B2
(45) Date of Patent: Nov. 23, 2010

(54) THIN-FILM TRANSISTOR, ELECTRONIC CIRCUIT, DISPLAY UNIT, AND ELECTRONIC DEVICE

(75) Inventors: Soichi Moriya, Chino (JP); Takeo Kawase, Suwa (JP)

(73) Assignee: Seiko Epson Corporation (JP)

( * ) Notice: Subject to any disclaimer, the term of this patent is extended or adjusted under 35 U.S.C. 154(b) by 40 days.

(21) Appl. No.: 11/565,714

(22) Filed: Dec. 1, 2006

(65) Prior Publication Data

US 2007/0126002 A1    Jun. 7, 2007

(30) Foreign Application Priority Data

Dec. 2, 2005    (JP) ............... 2005-349984
Oct. 16, 2006   (JP) ............... 2006-281994

(51) Int. Cl.
    *H01L 31/062* (2006.01)
(52) U.S. Cl. ............ 257/288; 257/40; 257/347; 257/411; 257/E29.151; 257/E51.007
(58) Field of Classification Search ........... 257/40, 257/347, 411, 288
    See application file for complete search history.

(56) References Cited

U.S. PATENT DOCUMENTS

| | | | | |
|---|---|---|---|---|
| 2004/0214381 A1* | 10/2004 | Ohta | ........... | 438/197 |
| 2005/0159001 A1* | 7/2005 | Kim et al. | ........... | 438/689 |
| 2005/0205861 A1* | 9/2005 | Bao et al. | ........... | 257/40 |
| 2005/0285102 A1* | 12/2005 | Koo et al. | ........... | 257/40 |
| 2006/0113523 A1* | 6/2006 | Kubota et al. | ........... | 257/40 |
| 2006/0231829 A1* | 10/2006 | Wu et al. | ........... | 257/40 |
| 2007/0215957 A1* | 9/2007 | Chen et al. | ........... | 257/411 |

FOREIGN PATENT DOCUMENTS

| | | | |
|---|---|---|---|
| JP | 2002-110999 | * | 4/2002 |
| JP | 2004-55649 | * | 2/2004 |

OTHER PUBLICATIONS

Chen et al., "Organic thin-film transistors with nanocomposite dielectric gate insualtor", Applied Physics Letters, vol. 85, No. 15, pp. 3295-3297, Oct. 11, 2004.*
Song, "Effects of Hydrophobic Treatment on the Performance of Pentacene TFT" IKEE International Transaction on EA, 12C-2, 136-138 (2002).*
"Plastic Data Book" published by Kogyo Chosakai Publishing, Inc. and written and edited by Asahi Kasei Amidas Co., Ltd. and the editorial department of "Plastics", Dec. 1, 1999, pp. 187-188 (with English translation).

\* cited by examiner

*Primary Examiner*—A. Sefer
(74) *Attorney, Agent, or Firm*—Harness, Dickey & Pierce, P.L.C.

(57) ABSTRACT

A thin-film transistor includes a gate electrode, a source electrode, a drain electrode, a semiconductor layer, and a gate insulating layer for insulating the source electrode and the drain electrode from the gate electrode, wherein the gate insulating layer includes composite particles in which a hydrophobic compound is provided on the surfaces of insulating inorganic particles.

15 Claims, 6 Drawing Sheets

THIN-FILM TRANSISTOR, ELECTRONIC CIRCUIT, DISPLAY UNIT, AND ELECTRONIC DEVICE

BACKGROUND

1. Technical Field

The present invention relates to a thin-film transistor, an electronic circuit, a display unit, and an electronic device.

2. Related Art

Recently, organic thin-film field-effect transistors including an organic semiconductor material have attracted attention as a device that can replace thin-film field-effect transistors including an inorganic material such as silicon. In such organic thin-film transistors, a semiconductor layer can be formed by a liquid phase process that does not require a high temperature or a high vacuum. in addition, the organic thin-film transistors are advantageous in that, for example, they can be thinner and lighter than the inorganic thin-film transistors, they have flexibility, and the cost of materials is low. In light of these characteristics, the organic thin-film transistors are expected to be used as a switching element of flexible displays and so forth.

A top-gate structure and a bottom-gate structure have been proposed as such thin-film transistors In the top-gate structure, a source electrode and a drain electrode are provided on a substrate in parallel, an organic semiconductor layer is provided between the source electrode and the drain electrode, and a gate insulating layer and a gate electrode are provided thereon in that order. In the bottom-gate structure, a gate electrode and a gate insulating layer are provided on a substrate in that order, a source electrode and a drain electrode are provided on the gate insulating layer in parallel, and an organic semiconductor layer is provided between the source electrode and the drain electrode.

In the organic thin-film transistors, preferably, components other than the organic semiconductor layer can also be formed by a liquid phase process. Examples of a gate insulating layer formed by a liquid phase process include a $SiO_2$ film prepared by applying a solution of polysilazane and heat-treating the solution at a temperature of about 400° C., and a spin-on-glass (SOG) film prepared by applying a solution of an organic silicon compound and heat-treating the solution at a temperature of about 400° C.

However, heat treatment at about 400° C. is required in order to form the above gate insulating layer, resulting in a problem of thermal degradation of the organic semiconductor layer and a plastic substrate by heating. Another example of an insulating film formed by a liquid phase process is an organic polymer film prepared by applying a solution of an organic polymeric material or a precursor thereof and performing an after-treatment. This after-treatment is, for example, a formation treatment of a cross-linked structure or a polymerization treatment of the precursor, and performed by heating at a temperature significantly lower than 400° C., for example, at about 100° C. Accordingly, when an organic polymer film is used as a gate insulating film, the above-described problem of thermal degradation of the organic semiconductor layer etc. can be prevented. However, such an organic polymer film has a low withstand voltage characteristic and easily causes dielectric breakdown when the gate voltage increases (for example, see "Plastic Data Book" published by Kogyo Chosakai Publishing, Inc. and written and edited by Asahi Kasei Amidas Co., Ltd. and the editorial department of "Plastics", Dec. 1, 1999, pp. 187-188).

SUMMARY

An advantage of some aspects of the invention is that it provides a thin-film transistor including a gate insulating layer having an excellent withstand voltage characteristic, and an electronic circuit, a display unit, and an electronic device that have high reliability.

Such an advantage can be achieved by the following embodiments of the invention. A thin-film transistor according to an embodiment of the invention includes a gate electrode, a source electrode, a drain electrode, a semiconductor layer, and a gate insulating layer for insulating the source electrode and the drain electrode from the gate electrode, wherein the gate insulating layer includes composite particles in which a hydrophobic compound is provided on the surfaces of insulating inorganic particles. Accordingly, a thin-film transistor including a gate insulating layer having an excellent withstand voltage characteristic can be provided.

In the thin-film transistor according to an embodiment of the invention, the gate insulating layer preferably includes an insulating polymer. The insulating polymer functions as a binder for binding the composite particles with each other. Consequently, a phenomenon in which the composite particles are easily separated from the gate insulating layer can be prevented. In this case, the gate insulating layer preferably includes a base material composed of the insulating polymer and the composite particles dispersed in the base material. Accordingly, the gate insulating layer can be formed by a liquid phase process without performing heat treatment at a high temperature.

In this case, the insulating polymer preferably includes polymethylmethacrylate as a main component. Polymethylmethacrylate is preferred in view of the excellent insulating property thereof and the high reactivity thereof with various polymerizable groups. The hydrophobic compound preferably has a reactive group that can be reacted with the insulating polymer. Accordingly, the composite particles are strongly held (carried) in a matrix composed of the insulating polymer, and thus separation of the composite particles from the matrix can be reliably prevented.

In the thin-film transistor according to an embodiment of the invention, the hydrophobic compound is preferably a coupling agent having a hydrophobic structure. The coupling agent has a hydrolyzable group (reactive group) and an organic chain (hydrophobic structure). In the coupling agent, a group produced by hydrolysis of the hydrolyzable group is chemically bonded to a functional group (for example, a hydroxyl group) disposed on the surfaces of the insulating inorganic particles by an acid-base reaction. As a result, a dense and strong hydrophobic coating layer can be formed on the surfaces of the insulating inorganic particles.

In the thin-film transistor according to an embodiment of the invention, the insulating inorganic particles preferably have a granular or acicular shape. Accordingly, the insulating inorganic particles can be more uniformly dispersed in the insulating polymer (matrix). In the thin-film transistor according to an embodiment of the invention, the insulating inorganic particles preferably have an average particle diameter in the range of 5 to 30 nm. The use of insulating inorganic particles having an average particle diameter within the above range can further improve the dispersibility of the composite particles (insulating inorganic particles) to the insulating polymer (matrix).

In the thin-film transistor according to an embodiment of the invention, preferably, the insulating inorganic particles are primarily composed of an inorganic oxide. Inorganic oxides particularly have a good insulating property compared with organic substances. In addition, particles primarily composed of an inorganic oxide are preferred from the standpoint that particles having the above-described shape and size are relatively easily available at low cost.

In this case, the inorganic oxide is preferably at least one selected from silicon oxide, aluminum oxide, zirconium oxide, cerium oxide, zinc oxide, cobalt oxide, lead zirconate titanate, lead titanate, titanium oxide, and tantalum oxide. These oxides particularly have a high dielectric constant. The use of these insulating inorganic particles can more reliably drive the thin-film transistor at a low voltage, resulting in a decrease in electrical power consumption and a further improvement in reliability of the thin-film transistor.

In the thin-film transistor according to an embodiment of the invention, the content of the composite particles in the gate insulating layer is preferably 15 weight percent or more. When the content of the composite particles is within this range, a satisfactory withstand voltage characteristic can be imparted to the gate insulating layer.

A thin-film transistor according to another embodiment of the invention includes a gate electrode, a source electrode, a drain electrode, a semiconductor layer, and a gate insulating layer for insulating the source electrode and the drain electrode from the gate electrode, wherein the gate insulating layer includes a base material composed of an insulating polymer and insulating inorganic particles dispersed in the base material. Accordingly, a thin-film transistor including a gate insulating layer that has an excellent withstand voltage characteristic and that can be formed by a liquid phase process without performing heat treatment at a high temperature can be obtained. In this case, a hydrophobic compound is preferably provided on the surfaces of the insulating inorganic particles. Accordingly, satisfactory dispersibility can be obtained compared with the insulating inorganic particles, and the particles can be dispersed in the insulating polymer (matrix) more uniformly. As a result, the gate insulating layer can exhibit more uniform characteristics.

In the thin-film transistor according to an embodiment of the invention, preferably, the semiconductor layer is primarily composed of an organic semiconductor material. A semiconductor layer including an organic semiconductor material as a main material is preferable because it can be formed at a low temperature. This is advantageous in that the semiconductor layer can be prepared at low cost, and a plastic substrate that is more inexpensive and flexible can be used.

An electronic circuit according to an embodiment of the invention includes the thin-film transistor according to an embodiment of the invention. Consequently, an electronic circuit having high reliability can be provided. A display unit according to an embodiment of the invention includes the electronic circuit according to an embodiment of the invention. Consequently, a display unit having high reliability can be provided. An electronic device according to an embodiment of the invention includes the display unit according to an embodiment of the invention. Consequently, an electronic device having high reliability can be provided.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
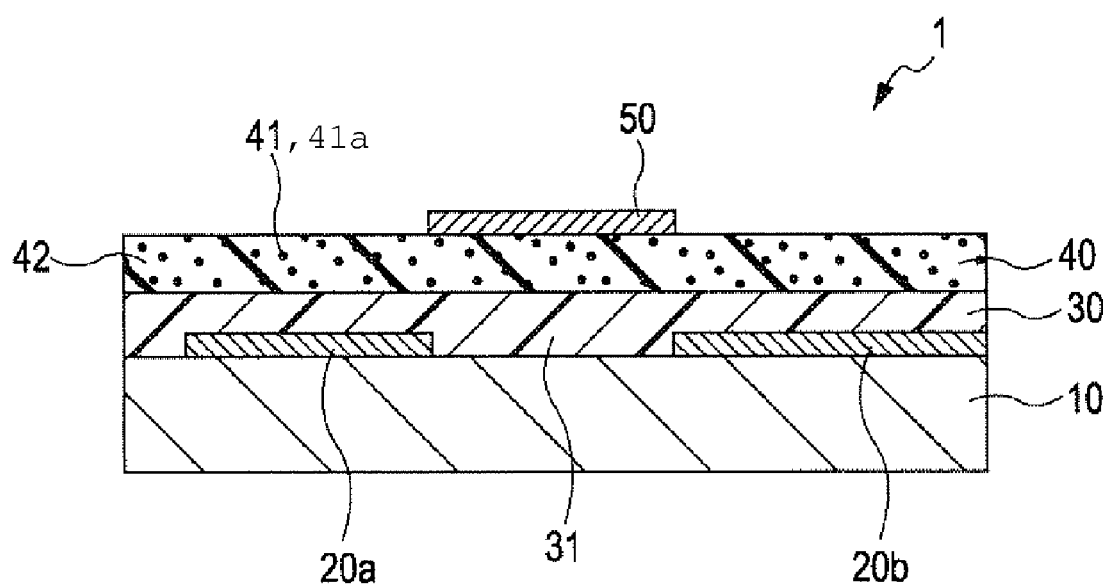
FIG. 1 is a schematic cross-sectional view showing a thin-film transistor according to a first embodiment of the invention.

A thin-film transistor, an electronic circuit, a display unit, and an electronic device of the invention will now be described in detail on the basis of preferred embodiments shown in the drawings.

First Embodiment

A thin-film transistor according to a first embodiment of the invention will now be described. FIG. 1 is a schematic cross-sectional view showing the thin-film transistor according to the first embodiment of the invention. FIGS. 2A to 2D are views (longitudinal cross-sectional views) illustrating a method of producing the thin-film transistor shown in FIG. 1.

A thin-film transistor 1 shown in FIG. 1 is a top-gate thin-film transistor. The thin-film transistor 1 includes a source electrode 20a and a drain electrode 20b that are separately provided, an organic semiconductor layer 30 provided so as to cover the source electrode 20a and the drain electrode 20b, and a gate insulating layer 40 provided between the organic semiconductor layer 30 and a gate electrode 50. These electrodes and layers are provided on a substrate 10.

The structures of individual parts will be described in order. The substrate 10 supports the layers (parts) constituting the thin-film transistor 1. Examples of the substrate 10 include a glass substrate; a plastic substrate (resin substrate) made of polyethylene terephthalate (PET), polyethylene naphthalate (PEN), polyethersulfone (PES), an aromatic polyester (liquid crystal polymer), a polyimide (PI), or the like; a quartz substrate; a silicon substrate; a metal substrate; and a gallium arsenide substrate.

When flexibility is imparted to the thin-film transistor 1, a plastic substrate or a thin metal substrate (having a relatively small thickness) is selected as the substrate 10. The source electrode 20a and the drain electrode 20b are provided on the substrate 10. Any known electrode materials may be used for the source electrode 20a and the drain electrode 20b, and the type of material used is not particularly limited. Specific examples thereof include metallic materials such as Cr, Al, Ta, Mo, Nb, Cu, Ag, Au, Pd, In, Ni, Nd, Co, and alloys thereof; and oxides thereof.

The source electrode 20a and the drain electrode 20b may be composed of a conductive organic material. The average thicknesses of the source electrode 20a and the drain electrode 20b are not particularly limited, but each of the thicknesses is preferably in the range of about 10 to 2,000 nm, and more preferably in the range of about 50 to 1,000 nm. On the substrate 10, the organic semiconductor layer 30 is provided so as to cover the source electrode 20a and the drain electrode 20b. The organic semiconductor layer 30 includes an organic semiconductor material (organic material that exhibits a semiconducting electrical conduction) as the main material.

Examples of such an organic semiconductor material include low-molecular-weight organic semiconductor materials such as naphthalene, anthracene, tetracene, pentacene, hexacene, phthalocyanine, perylene, hydrazone, triphenylmethane, diphenylmethane, stilbene, aryl vinyl, pyrazoline, triphenylamine, triarylamine, and derivatives thereof; and high-molecular-weight organic semiconductor materials such as poly-N-vinylcarbazole, polyvinylpyrene, fluorenebithiophene copolymers and derivatives thereof, polyvinyl anthracene, polythiophene, poly(p-phenylenevinylene), a pyrene-formaldehyde resin, and an ethylcarbazole-formaldehyde resin. These may be used alone or in combinations of two or more materials. In particular, a high-molecular-weight organic semiconductor material is preferably used as the main material. The organic semiconductor layer 30 including a high-molecular-weight organic semiconductor material as the main material can realize a reduction in thickness and weight and has excellent flexibility. Therefore, such an organic semiconductor layer 30 is suitable for an application to a thin-film transistor used as a switching element of flexible displays or the like.

Furthermore, the organic semiconductor layer 30 is preferable because it can be formed at a low temperature. This is advantageous in that the organic semiconductor layer 30 can be prepared at low cost, and a plastic substrate that is more inexpensive and flexible can be used. The average thickness of the organic semiconductor layer 30 is preferably in the range of about 0.1 to 1,000 nm, more preferably in the range of about 1 to 500 nm, and still more preferably in the range of about 1 to 100 nm.

The organic semiconductor layer 30 need not be provided so as to cover the source electrode 20a and the drain electrode 20b. It is sufficient that the organic semiconductor layer 30 is provided on at least an area (channel area 31) disposed between the source electrode 20a and the drain electrode 20b. In the invention, instead of the organic semiconductor layer 30, the semiconductor layer may be composed of an inorganic semiconductor layer made of $SiO_2$, SiN, or the like.

The gate insulating layer 40 is provided on the organic semiconductor layer 30. In the gate insulating layer 40 of this embodiment, composite particles 41 in which a hydrophobic compound is provided on the surfaces of insulating inorganic particles are dispersed in a matrix (base material) 42 composed of an insulating polymer. The insulating particles exhibit an excellent insulating property compared with the insulating polymer. Therefore, when the gate insulating layer 40 contains the insulating particles as in this embodiment, dielectric breakdown caused by migration etc. can be reliably prevented. Accordingly, the gate insulating layer 40 can exhibit an excellent withstand voltage characteristic compared with a gate insulating film composed of only the insulating polymer.

In addition, the dielectric constant of the insulating particles is higher than that of the insulating polymer. Therefore, the gate insulating layer 40 containing these insulating particles has a high dielectric constant. As a result, an operation at a lower gate voltage (low-voltage driving) of the thin-film transistor 1 can be achieved to reduce electrical power consumption and to improve reliability of the thin-film transistor 1. In particular, in the composite particles 41, a coating layer composed of the hydrophobic compound is formed in the vicinity of the surfaces thereof, thereby preventing hydrophilic functional groups (for example, hydroxyl groups) that are present on the surfaces of the insulating inorganic particles from being exposed on the surfaces of the composite particles 41. As a result, the water absorption percentage of the gate insulating layer 40 can be decreased, thus reliably preventing the generation of leakage current due to water absorption.

Furthermore, since the number of hydrophilic functional groups, the number of unpaired electrons, and the like that are present at the interface (channel area 31) with the organic semiconductor layer 30 are decreased, trapping of carriers induced in the organic semiconductor layer 30 by hydrophilic functional groups and unpaired electrons can be suppressed. Accordingly, satisfactory transistor characteristics can be achieved in the thin-film transistor 1. Such a gate insulating layer 40 in which the composite particles 41 are dispersed in the matrix 42 can be formed by a liquid phase process as described below. More specifically, the gate insulating layer 40 can be prepared by forming a liquid film using a liquid material containing the composite particles 41 and the insulating polymer, and then drying the liquid film. Therefore, a large apparatus for generating a high-temperature and high-vacuum atmosphere is not necessary, and the thin-film transistor 1 can be easily formed with a simple apparatus.

Since the drying of the liquid film is a process performed at a relatively low temperature, such as heat treatment at about 100° C. or an irradiation of infrared rays, thermal degradation of the organic semiconductor layer 30 and the substrate 10 can be prevented. Furthermore, since a coating layer is formed on the surfaces of the composite particles 41, satisfactory dispersibility can be obtained compared with the insulating inorganic particles, and the composite particles 41 can be dispersed in the insulating polymer (matrix 42) more uniformly. Accordingly, the gate insulating layer 40 exhibits more uniform characteristics. The shape of the insulating inorganic particles used for the composite particles 41 is not particularly limited, but is preferably a granular or acicular (rod-like) shape. In such a case, the composite particles 41 can be more uniformly dispersed in the insulating polymer (matrix 42).

The average particle diameter of the insulating inorganic particles is not particularly limited, but is preferably in the range of 5 to 30 nm and more preferably in the range of 10 to 20 nm. For the purpose of this description, the average particle diameter of the insulating inorganic particles means the average of the longest part of the particles. The use of insulating inorganic particles having an average particle diameter within the above range can further improve the dispersibility of the composite particles 41 (insulating inorganic particles) to the insulating polymer (matrix 42). Examples of the material of the insulating inorganic particles include inorganic oxides, inorganic nitrides, and inorganic oxynitrides. Among these, particles primarily composed of an inorganic oxide are preferred. Inorganic oxides particularly have a good insulating property. In addition, particles primarily composed of an inorganic oxide are preferred from the standpoint that particles having the above-described shape and size are relatively easily available at low cost, Examples of the inorganic oxides include silicon oxide, aluminum oxide, zirconium oxide, cerium oxide, zinc oxide, cobalt oxide, lead zirconate titanate, lead titanate, titanium oxide, and tantalum oxide. These may be used alone or in combinations of two or more oxides. In particular, at least one of silicon oxide, aluminum oxide, zirconium oxide, cerium oxide, zinc oxide, cobalt oxide, lead zirconate titanate, lead titanate, titanium oxide, and tantalum oxide is preferred. These oxides particularly have a high dielectric constant. The use of these insulating inorganic particles can more reliably drive the thin-film transistor 1 at a low voltage, resulting in a decrease in electrical power consumption and a further improvement in reliability of the thin-film transistor 1.

As regards the hydrophobic compound bonded on the surfaces of the insulating inorganic particles, a compound having a hydrophobic structure and a reactive group that is reacted with a functional group disposed on the surfaces of the insulating inorganic particles is preferred. Herein, the hydrophobic structure means a structure that exhibits higher hydrophobicity than the surface of the insulating inorganic particles. By using such a hydrophobic compound, the hydrophobic compound can be strongly fixed on the surfaces of the insulating inorganic particles.

A coupling agent having a hydrophobic structure is preferably used as the hydrophobic compound. The coupling agent has a hydrolyzable group (reactive group) and an organic chain (hydrophobic structure) In the coupling agent, a group produced by hydrolysis of the hydrolyzable group is chemically bonded to the functional group (for example, a hydroxyl group) disposed on the surfaces of the insulating inorganic particles by an acid-base reaction. As a result, a dense and strong hydrophobic coating layer can be formed on the surfaces of the insulating inorganic particles.

Examples of the coupling agent include, but are not limited to, silane coupling agents, titanate coupling agents, organic phosphoric acid coupling agents, and silyl peroxide coupling agents. An inorganic element, such as silicon, titanium, or phosphorus, contained in the coupling agent is preferably the same as the inorganic element that is contained in the insulating inorganic particles. In such a case, a coating layer can be formed on the surfaces of the insulating inorganic particles while the characteristics of the insulating inorganic particles are maintained. More specifically, for example, a compound represented by a general formula $R^1(CH_2)_m SiR^2{}_2 X_{3-n}$ is preferably used as the silane coupling agent.

In this general formula, each of $R^1$ and $R^2$ represents an element or an atomic group, X represents a hydrolyzable group, m represents a natural number, and n represents 1 or 2. Specific examples of $R^1$ include a hydrogen atom (—H), a methyl group (—CH$_3$), a trifluoromethyl group (—CF$_3$), an amino group (—NH$_2$), and a mercapto group (—SH). By selecting this $R^1$, the threshold voltage of the thin-film transistor 1 can be controlled.

For example, when the compound has at least one trifluoromethyl group (—CF$_3$), the threshold voltage of the thin-film transistor 1 can be shifted to the plus side. When the compound has at least one amino group (—NH$_2$), the threshold voltage of the thin-film transistor 1 can be shifted to the minus side, In the formula, $R_1$ preferably has a reactive group (polymerizable group) that can be reacted with the insulating polymer. Accordingly, the composite particles 41 can be strongly held (carried) in the matrix 42 composed of the insulating polymer, and thus separation of the composite particles 41 from the matrix 42 can be reliably prevented. That is, the adhesiveness between the insulating polymer and the composite particles 41 can be improved. Consequently, since the gate insulating layer 40 becomes denser, dielectric breakdown caused by migration etc. can be reliably prevented, and the withstand voltage characteristic of the gate insulating layer 40 can be improved. Accordingly, it is believed that, in the case where $R_1$ has a reactive group that can be reacted with the insulating polymer, even when a relatively small amount of composite particles 41 is dispersed in the matrix 42, the withstand voltage characteristic of the gate insulating layer 40 can be improved. Examples of the reactive group include an amino group, a mercapto group, a (meth)acryloyl group, a vinyl group, alkenyl groups, and alkynyl groups.

In the formula, X is preferably a halogen group or an alkoxy group. These groups are easily bonded to hydrophilic functional groups that are present on the surfaces of the insulating inorganic particles because these groups have high reactivity. Accordingly, a dense and strong coating layer can be formed on the surfaces of the insulating inorganic particles. When the insulating inorganic particles do not have hydrophilic functional groups on their surfaces, a process for introducing hydrophilic functional groups into the surfaces of the insulating inorganic particles is preferably performed in advance.

In addition to the coupling agents, for example, surfactants having an insulating structure may be used as the hydrophobic compound. The amount (content) of the composite particles 41 in the gate insulating layer 40 is preferably 15 weight percent or more, and more preferably in the range of about 25 to 50 weight percent, When the content of the composite particles 41 is within this range, a satisfactory withstand voltage characteristic can be imparted to the gate insulating layer 40.

The insulating polymer constitutes the matrix 42 of the gate insulating layer 40 and also functions as a binder that binds the composite particles 41 with each other. Accordingly, a phenomenon in which the composite particles 41 are easily separated from the gate insulating layer 40 can be prevented. Examples of the insulating polymer include acrylic resins such as polymethylmethacrylate, polyimides, polyvinylphenol, polystyrene, polyvinyl alcohol, and polyvinyl acetate. These may be used alone or in combinations of two or more polymers. Among these, polymers containing an acrylic resin as a main component are preferred. Acrylic resins are preferable in view of the excellent insulating property thereof and the high reactivity thereof with various polymerizable groups.

The average thickness of the gate insulating layer 40 is not particularly limited, but is preferably in the range of about 10 to 5,000 nm, and more preferably in the range of about 50 to 1,000 nm. When the thickness of the gate insulating layer 40 is within this range, the operating voltage of the thin-film transistor 1 can be decreased while the source electrode 20a and the drain electrode 20b are reliably insulated from the gate electrode 50. The gate electrode 50 is provided at a predetermined position on the gate insulating layer 40, i.e., at a position corresponding to the area between the source electrode 20a and the drain electrode 2b. The material of the gate electrode 50 may be the same as the above-described conductive material used for the source electrode 20a and the drain electrode 20b.

The average thickness of the gate electrode 50 is not particularly limited, but is preferably in the range of about 0.1 to 2,000 nm, and more preferably in the range of about 1 to 1,000 nm. In such a thin-film transistor 1, when a gate voltage is applied to the gate electrode 50 while a voltage is applied between the source electrode 20a and the drain electrode 20b, a channel is formed in the vicinity of the interface of the organic semiconductor layer 30 with the gate insulating layer 40. Carriers (holes) move in the channel area 31, and thus an electric current flows between the source electrode 20a and the drain electrode 2b.

That is, in an OFF state where no voltage is applied to the gate electrode 50, even when a voltage is applied between the source electrode 20a and the drain electrode 20b, only a minute electric current flows because carriers are negligibly present in the organic semiconductor layer 30. In contrast, in an ON state where a voltage is applied to the gate electrode 50, electric charges are induced in an area of the organic semiconductor layer 30, the area facing the gate insulating layer 40, to form a channel (flow path of carriers). When a voltage is applied between the source electrode 20a and the drain electrode 20b in this state, an electric current flows through the channel area 31.

The thin-film transistor 1 can be produced, for example, as follows. A method of producing the thin-film transistor 1 shown in FIG. 1 includes a step [A1] of forming the source electrode 20a and the drain electrode 20b on the substrate 10, a step [A2] of forming the organic semiconductor layer 30 so as to cover the source electrode 20a and the drain electrode 20b, a step [A3] of forming the gate insulating layer 40 on the organic semiconductor layer 30, and a step [A4] of forming the gate electrode 50 on the gate insulating layer 40.

[A1] Step of Forming Source Electrode and Drain Electrode

Figure 2A:
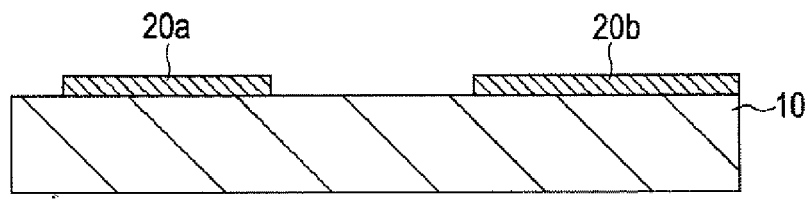
FIGS. 2A to 2D are longitudinal cross-sectional views illustrating a method of producing the thin-film transistor shown in FIG. 1.

A source electrode 20a and a drain electrode 20b are formed on a substrate 10 (see FIG. 2A). First, a metal film (metal layer) is formed on the substrate 10. The metal film can be formed by, for example, chemical vapor deposition (CVD) such as plasma CVD, thermal CVD, or laser CVD; a dry plating process such as vacuum evaporation, sputtering (low-temperature sputtering), or ion plating; a wet plating process such as electrolytic plating, immersion plating, or electroless plating; thermal spraying; a sol-gel method, a metal organic deposition (MOD) method; or joining metal foils.

A resist material is applied on the metal film and is then cured to form a resist layer having a pattern corresponding to the shapes of the source electrode 20a and the drain electrode 20b. Unnecessary parts of the metal film are removed using this resist layer as a mask. The metal film can be removed by, for example, a physical etching method such as plasma etching, reactive ion etching, beam etching, or photo-assisted etching; or a chemical etching method such as wet etching. These may be used alone or in combinations of two or more methods. The resist layer is then removed to form the source electrode 20a and the drain electrode 20b.

Alternatively, the source electrode 20a and the drain electrode 20b can be formed as follows. For example, a conductive material containing conductive particles or a conductive organic material is applied (supplied) on the substrate 10 to form a film, and an after-treatment (for example, heating, irradiation of infrared rays, or application of ultrasonic waves) is then performed for the film as required. Examples of the conductive material containing conductive particles include solutions prepared by dispersing metal fine particles and polymer mixtures containing conductive particles. Examples of the conductive material containing a conductive organic material include solutions or dispersion liquids of a conductive organic material.

Examples of the method of applying (supplying) the conductive material on the substrate 10 include coating methods such as spin coating, casting, microgravure coating, gravure coating, bar coating, roll coating, wire-bar coating, dip coating, and spray coating; and printing methods such as screen printing, flexographic printing, offset printing, ink-jetting, and microcontact printing. These may be used alone or in combinations of two or more methods.

[A2] Step of Forming Organic Semiconductor Layer

Figure 2B:
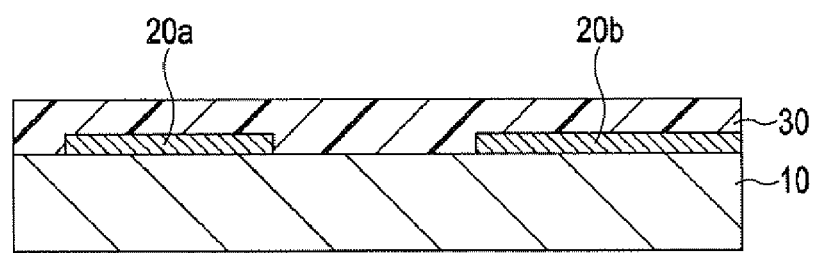

Next, an organic semiconductor layer 30 is formed so as to cover the source electrode 20a and the drain electrode 20b (see FIG. 2B). In this step, a channel area 31 is formed between the source electrode 20a and the drain electrode 2b. When the organic semiconductor layer 30 is formed using a polymeric organic semiconductor material (high-molecular-weight organic semiconductor material), the organic semiconductor layer 30 can be formed by, for example, an application method such as a method with a spin coater or a dipping method, or a printing method such as an ink-jetting method or a screen printing method.

When the organic semiconductor layer 30 is formed using a low-molecular-weight organic semiconductor material, the organic semiconductor layer 30 can be formed as follows. First, a film is formed by vacuum evaporation or the following method. A soluble precursor of the low-molecular-weight organic semiconductor material is used, and a film is formed by an application method such as a method with a spin coater or a dipping method, or a printing method such as an ink-jetting method or a screen printing method. Annealing of the film is then performed to form a desired organic semiconductor layer 30.

The area where the organic semiconductor layer 30 is formed is not limited to the area shown in the figure. The organic semiconductor layer 30 may be formed on only the area (channel area 31) between the source electrode 20a and the drain electrode 20b. In such a case, when a plurality of thin-film transistors (elements) 1 are provided on a substrate in parallel, the organic semiconductor layer 30 for each element can be independently formed, thereby suppressing leakage current and cross talk between the elements. Furthermore, the amount of organic semiconductor material used can be reduced, thus reducing the production cost.

[A3] Step of Forming Gate Insulating Layer

Figure 2C:
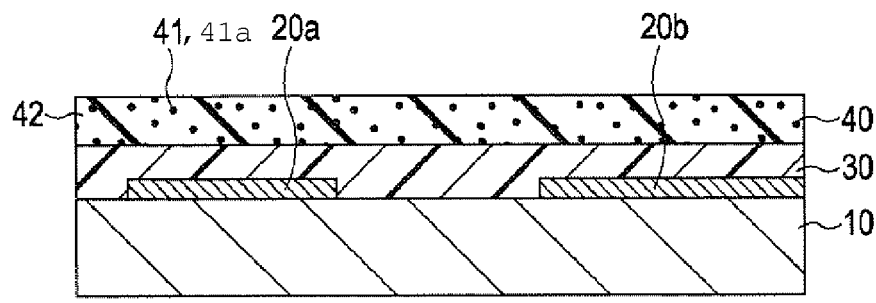

Next, a gate insulating layer 40 is formed on the organic semiconductor layer 30 (see FIG. 2C). First, insulating inorganic particles are prepared. A surface treatment for applying a hydrophobic compound on the surfaces 41a of the insulating inorganic particles is performed. Accordingly, composite particles 41 in which a coating layer is formed on the surfaces of the insulating inorganic particles can be obtained. This surface treatment can be performed by a dry process, a wet process, a spray process, or the like.

In the dry process, the coating layer is formed by jetting the hydrophobic compound or a solution of the hydrophobic compound onto the insulating inorganic particles while the insulating inorganic particles are mixed with a mixer such as a V-blender. In the wet process, the insulating inorganic particles are dispersed in water to prepare a slurry. The hydrophobic compound or a solution of the hydrophobic compound is added to the slurry, and the mixture is stirred. Subsequently, the reaction solution is left to stand to separate the insulating inorganic particles by sedimentation, and the particles are then dried. Thus, the coating layer is formed on the surfaces of the insulating inorganic particles. In the spray process, the coating layer is formed by spraying the hydrophobic compound or a solution of the hydrophobic compound onto the insulating inorganic particles at a high temperature immediately after removal from a furnace.

After the surface treatment is performed as described above, annealing is preferably performed. Thereby, the hydrophobic compound can be coated on the surfaces of the insulating inorganic particles in the form of a monomolecular film. Herein, the phrase "in the form of a monomolecular film" means a state in which at least a part of the hydrophobic compound constituting the coated layer forms a monomolecular film. The entire part of the coated layer may be in such a state. Alternatively, a part of the coated layer may form a monomolecular film, and other parts may form a built-up film in which the molecules are stacked.

Next, the resulting composite particles 41 are mixed with a solution containing an insulating polymer or a precursor thereof. A dispersion treatment under stirring and application of ultrasonic waves etc. is performed to prepare a liquid material. The liquid material is applied (supplied) so as to cover the organic semiconductor layer 30. An after-treatment (for example, heating, irradiation of infrared rays, or application of ultrasonic waves) is then performed for the film as required, thus forming the gate insulating layer 40.

When a compound having a reactive group (polymerizable group) that can be reacted with a functional group of the precursor of the insulating polymer is used as the hydrophobic compound, a bond is formed between the coated layer composed of the hydrophobic compound and the insulating polymer. Consequently, the composite particles 41 can be strongly held in the matrix 42 composed of the insulating polymer. In such a case, by polymerizing a precursor (for example, monomer or oligomer) of the insulating polymer and the hydrophobic compound in a liquid material containing the precursor of the insulating polymer, the hydrophobic compound having the reactive group, and the composite particles 41, the composite particles 41 can be strongly held in the matrix 42.

Furthermore, in this case, the liquid material used for forming the gate insulating layer 40 is prepared as follows. A precursor of the insulating polymer is reacted (polymerized) with the hydrophobic compound bound on the surfaces of the insulating inorganic particles, and a solvent is then added to prepare a liquid. The liquid material is supplied on the organic semiconductor layer 30 and then dried to form the gate insulating layer 40 in which the composite particles 41 are strongly held in the matrix 42.

A method of forming the gate insulating layer 40 in which the composite particles 41 are strongly held in the matrix 42 will now be described in detail using an example. In this example, a methacryloxysilane (methacryloxypropyltrimethoxysilane) having a structure represented by chemical formula 1 is used as the hydrophobic compound, methyl methacrylate is used as the precursor (monomer) of the insulating polymer, and silica ($SiO_2$) particles are used as the insulating inorganic particles.

[Ch. 1]

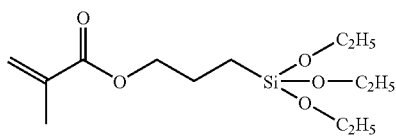

First, a methacryloxysilane solution prepared by dissolving the methacryloxysilane is added to a nanosilica-particle dispersion liquid prepared by dispersing the silica particles. The mixture is then stirred to prepare a methacryloxysilane-modified nanosilica dispersion liquid. Here, a hydroxyl group is present on the nano-level surface of a silica ($SiO_2$) particle in the form of a Si—OH structure. Accordingly, the ethoxy group, which is a hydrolyzable group of the methacryloxysilane, is reacted with the hydroxyl group, thereby forming a coating layer made of the methacryloxysilane on the surface of the silica ($SiO_2$) particle.

The dispersion medium and the solvent used for preparing the nanosilica-particle dispersion liquid and the methacryloxysilane solution, respectively, are not particularly limited, but aromatic solvents such as toluene, benzene, xylenes, and mesitylene, are preferably used. Among these, toluene is preferably used. The content of the methacryloxysilane in the methacryloxysilane solution is preferably in the range of about 5 to 40 weight percent and more preferably in the range of about 5 to 15 weight percent.

During the above stirring, ultrasonic waves may be applied. Subsequently, a methyl methacrylate solution prepared by dissolving methyl methacrylate is added to the methacryloxysilane-modified nanosilica dispersion liquid, and the mixture is then stirred. The solvent used for preparing the methyl methacrylate solution is not particularly limited, but toluene is preferably used as in the above case.

Next, a predetermined treatment such as a pressure reduction or heating is performed for the methacryloxysilane-modified nanosilica dispersion liquid containing the methyl methacrylate solution to remove an excessive amount of dispersion medium from the dispersion liquid. A thermal polymerization initiator such as benzoyl peroxide or 2,2'-azobisisobutyronitrile is added to the dispersion liquid, and the mixture is then heated to allow the methacryloxysilane to react with methyl methacrylate. Accordingly, a liquid material (material for forming gate insulating layer) containing a methacryloxysilane-modified nanosilica/acrylate in which the silica particles (composite particles 41) are strongly held in polymethylmethacrylate (matrix 42) can be prepared.

The temperature during heating after the addition of the thermal polymerization initiator is preferably in the range of about 25° C. to 100° C. and more preferably in the range of about 40° C. to 80° C. The pressure of the atmosphere during heating is preferably in the range of about 1 to 100 kPa and more preferably in the range of about 20 to 50 kPa. Furthermore, the heating time is preferably in the range of about 20 to 200 hours and more preferably in the range of about 60 to 120 hours.

Next, the liquid material containing the methacryloxysilane-modified nanosilica/acrylate is applied (supplied) on the organic semiconductor layer 30 and then dried to form the gate insulating layer 40. By using such a liquid material, a chemical bond is formed between the coated layer and the insulating polymer in the resulting gate insulating layer 40, and thus the composite particles 41 are strongly held in the matrix 42. Accordingly, the separation of the composite particles 41 can be reliably prevented.

As the method of applying (supplying) the liquid material on the organic semiconductor layer 30, the coating methods, the printing methods, and the like described in step [A2] can be employed. In the description of this embodiment, the methacryloxysilane and methyl methacrylate are polymerized, and the liquid material containing the polymer is then supplied on the organic semiconductor layer 30, but the method is not limited thereto. A liquid material containing the methacryloxysilane and methyl methacrylate may be supplied on the organic semiconductor layer 30, and these monomers may then be polymerized. Alternatively, the methacryloxysilane and methyl methacrylate may be polymerized a plurality of times before and after the liquid material is supplied on the organic semiconductor layer 30.

[A4] Step of Forming Gate Electrode

Figure 2D:
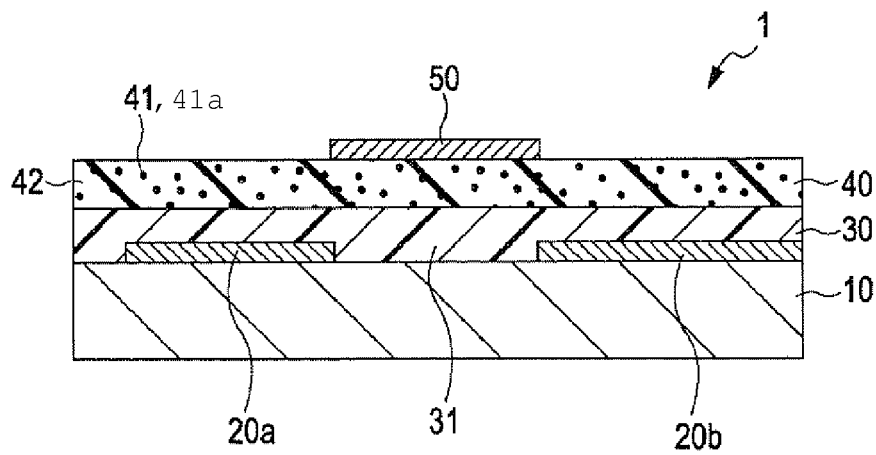

Next, a gate electrode 50 is formed on the gate insulating layer 40 (see FIG. 2D). The gate electrode 50 can be formed as in the source electrode 20a and the drain electrode 20b. By performing the above-described steps, the thin-film transistor 1 of the first embodiment can be produced.

In the thin-film transistor 1 of this embodiment, at least one layer may be added between the source electrode 20a and the drain electrode 20b, and the organic semiconductor layer 30; between the organic semiconductor layer 30 and the gate insulating layer 40; and between the gate insulating layer 40 and the gate electrode 50 for any purpose. In addition, the gate insulating layer 40 may be composed of only the composite particles 41 without using the insulating polymer (matrix 42). Alternatively, the application of the hydrophobic compound on the surfaces of the insulating inorganic particles may be omitted, and the gate insulating layer 40 may be composed of the insulating inorganic particles and the insulating polymer.

Second Embodiment

Figure 3:
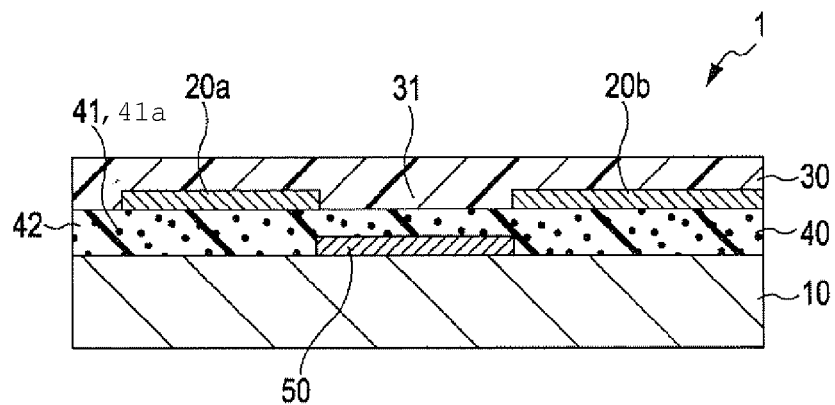
FIG. 3 is a schematic cross-sectional view showing a thin-film transistor according to a second embodiment of the invention.

A thin-film transistor according to a second embodiment of the invention will now be described. FIG. 3 is a schematic cross-sectional view showing a thin-film transistor according to the second embodiment of the invention. The thin-film transistor of the second embodiment will be described below. The difference between the thin-film transistor of the second embodiment and that of the first embodiment is mainly described and structures common to the second embodiment and the first embodiment are not described.

The overall structure of the thin-film transistor 1 of the second embodiment is different from that of the first embodiment, and other structures are the same as those of the thin-film transistor 1 of the first embodiment. That is, the thin-film transistor 1 shown in FIG. 3 is a bottom-gate thin-film transistor. In this bottom-gate thin-film transistor, the gate electrode 50 is disposed adjacent to the substrate 10, the gate insulating layer 40 is disposed so as to cover the gate electrode 50, and the source electrode 20a and the drain electrode 20b are disposed on the gate insulating layer 40. The structure of the gate insulating layer 40 is the same as that in the first embodiment. This thin-film transistor 1 can be produced, for example, as follows.

A method of producing the thin-film transistor 1 shown in FIG. 3 includes a step [B1] of forming the gate electrode 50 on the substrate 10, a step [B2] of forming the gate insulating layer 40 so as to cover the gate electrode 50, a step [B3] of forming the source electrode 20a and the drain electrode 20b on the gate insulating layer 40, and a step [B4] of forming the organic semiconductor layer 30 so as to cover the source electrode 20a, the drain electrode 20b, and the gate insulating layer 40.

[B1] Step of Forming Gate Electrode
The same step as step [A4] is performed.

[B2] Step of Forming Gate Insulating Layer
The same step as step [A3] is performed.

[B3] Step of Forming Source Electrode and Drain Electrode
The same step as step [A1] is performed.

[B4] Step of Forming Organic Semiconductor Layer
The same step as step [A2] is performed.

By performing the above-described steps, the thin-film transistor 1 of the second embodiment can be produced. The thin-film transistor 1 of the second embodiment also has the same operations and advantages as those in the thin-film transistor 1 of the first embodiment. Furthermore, since the thin-film transistor 1 of the second embodiment has the bottom-gate structure shown in FIG. 3, the thin-film transistor 1 also has the following advantage.

The resistances against heat, acids, and alkalis of many organic semiconductor materials are somewhat lower than those of inorganic semiconductor materials. In the bottom-gate structure of this embodiment, the organic semiconductor layer 30 can be formed after the gate electrode 50, the gate insulating layer 40, the source electrode 20a, and the drain electrode 20b are formed. Therefore, in the steps [B1] to [B3], more suitable processing conditions, for example, a processing method at a higher temperature or a processing method using a strong acid such as sulfuric acid, can be selected. Consequently, a characteristic (switching characteristic) of the thin-film transistor 1 produced can be further improved.

Third Embodiment

Figure 4:
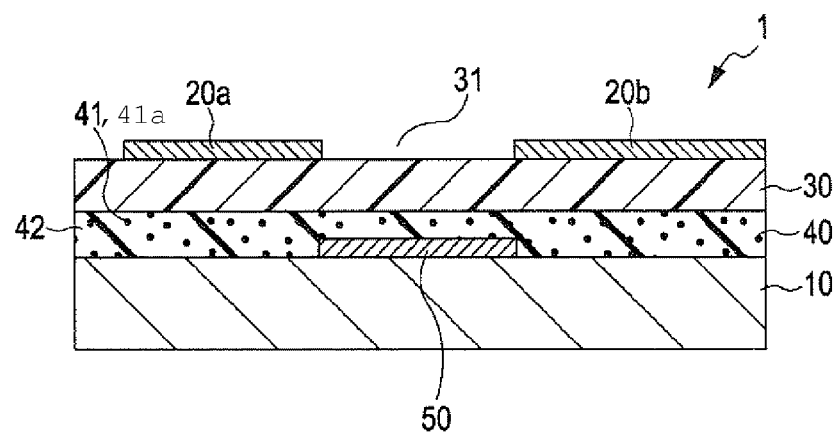
FIG. 4 is a schematic cross-sectional view showing a thin-film transistor according to a third embodiment of the invention.

A thin-film transistor according to a third embodiment of the invention will now be described. FIG. 4 is a schematic cross-sectional view showing a thin-film transistor according to the third embodiment of the invention. The thin-film transistor of the third embodiment will be described below. The difference between the thin-film transistor of the third embodiment and those of the first and second embodiments is mainly described and structures common to the third embodiment and the first and second embodiments are not described.

The positions of the source electrode 20a and the drain electrode 20b of the thin-film transistor 1 of the third embodiment are different from those of the second embodiment, and other structures are the same as those of the thin-film transistor 1 of the second embodiment. That is, in the thin-film transistor 1 shown in FIG. 4, the source electrode 20a and the drain electrode 20b are provided on the organic semiconductor layer 30. This thin-film transistor 1 can be produced, for example, as follows. A method of producing the thin-film transistor 1 shown in FIG. 4 includes a step [D1] of forming the gate electrode 50 on the substrate 10, a step [D2] of forming the gate insulating layer 40 so as to cover the gate electrode 50, a step [D3] of forming the organic semiconductor layer 30 on the gate insulating layer 40, and a step [D4] of forming the source electrode 20a and the drain electrode 20b on the organic semiconductor layer 30.

[D1] Step of Forming Gate Electrode
The same step as step [A4] is performed.

[D2] Step of Forming Gate Insulating Layer
The same step as step [A3] is performed.

[D3] Step of Forming Organic Semiconductor Layer
The same step as step [A2] is performed.

[D4] Step of Forming Source Electrode and Drain Electrode
The same step as step [A1] is performed.

By performing the above-described steps, the thin-film transistor 1 of the third embodiment can be produced. The thin-film transistor 1 of the third embodiment also has the same operations and advantages as those in the thin-film transistors 1 of the first and second embodiments. Furthermore, since the thin-film transistor 1 of the third embodiment has the bottom-gate structure shown in FIG. 4, this thin-film transistor 1 also has the same advantage as that in the thin-film transistor 1 of the second embodiment.

Display Unit

Figure 5:
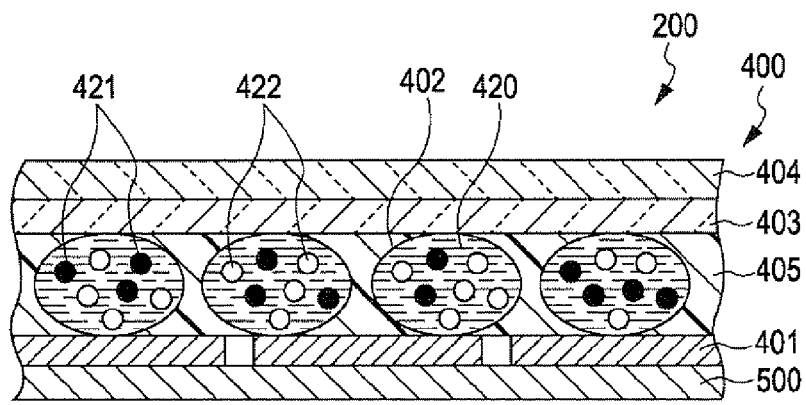
FIG. 5 is a longitudinal cross-sectional view showing an electrophoretic display unit implemented by a display unit according to an embodiment of the invention.
Figure 6:
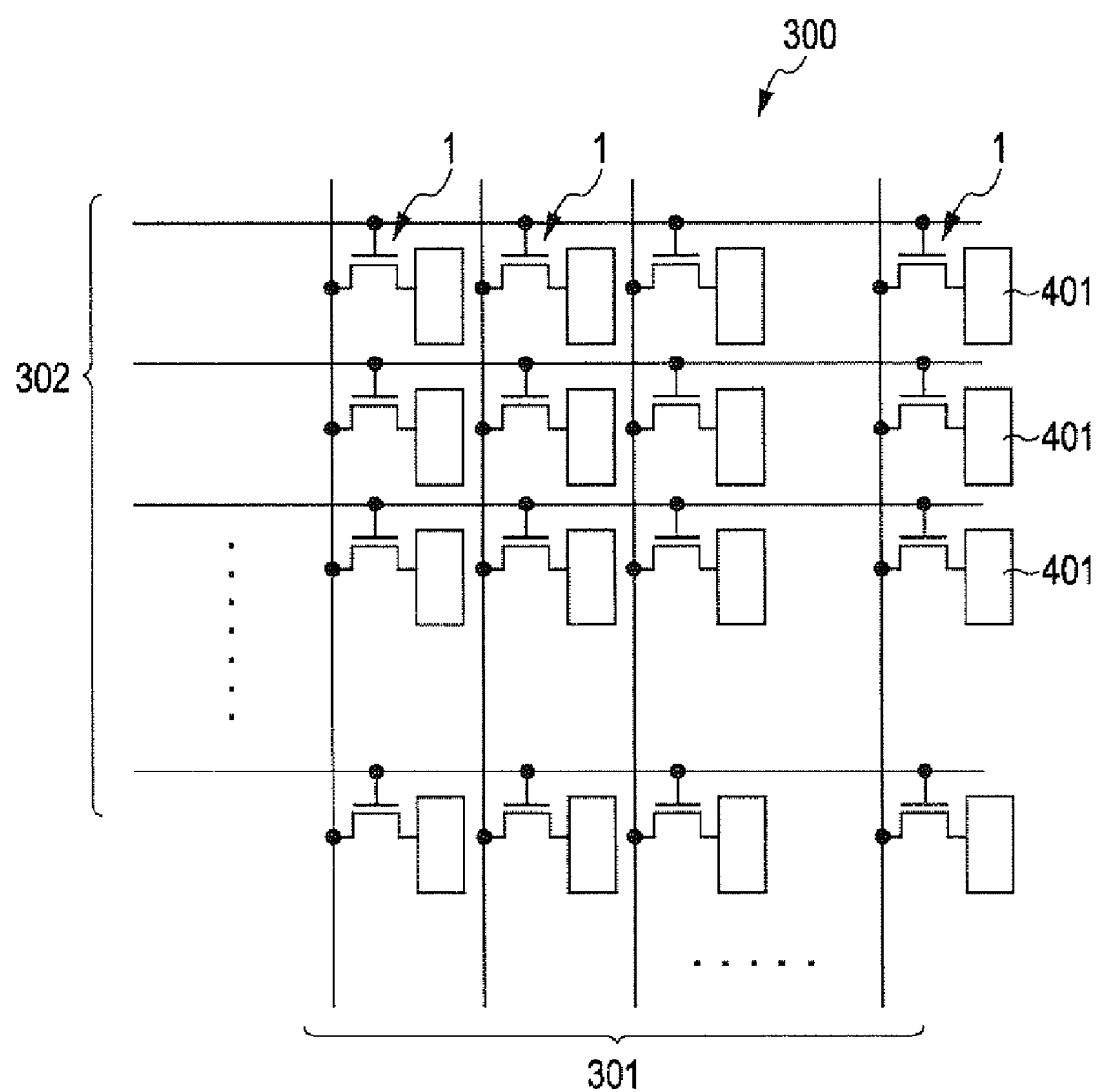
FIG. 6 is a block diagram showing the configuration of an active matrix device included in the electrophoretic display unit shown in FIG. 5.

A display unit in which an active matrix device including the above-described thin-film transistor 1 is installed will now be described using an example of an electrophoretic display unit. FIG. 5 is a longitudinal cross-sectional view showing an electrophoretic display unit implemented by a display unit according to an embodiment of the invention. FIG. 6 is a block diagram showing the configuration of an active matrix device included in the electrophoretic display unit shown in FIG. 5.

An electrophoretic display unit 200 shown in FIG. 5 is constituted by an active matrix device (electronic circuit) 300 provided on a substrate 500 and an electrophoretic display part 400 that is electrically connected to the active matrix device 300. As shown in FIG. 6, the active matrix device 300 includes a plurality of data lines 301 and a plurality of scanning lines 302 that are orthogonal to each other, and thin-film transistors 1 provided near individual intersections of the data lines 301 and the scanning lines 302.

The gate electrode 50 of the thin-film transistor 1 is connected to the scanning line 302, the source electrode 20a is connected to the data line 301, and the drain electrode 20b is connected to a pixel electrode (individual electrode) 401 described below. As shown in FIG. 5, the electrophoretic display part 400 includes pixel electrodes 401, microcapsules 402, a transparent electrode (common electrode) 403, and a transparent substrate 404, which are sequentially laminated on the substrate 500.

The microcapsules 402 are fixed between the pixel electrodes 401 and the transparent electrode 403 with a binder 405. The pixel electrodes 401 are provided in the form of a matrix, that is, so as to be regularly arrayed in the vertical direction and in the horizontal direction. Each microcapsule 402 includes an electrophoretic dispersion liquid 420 containing plural types of electrophoretic particles having different characteristics, in this embodiment, containing two types of electrophoretic particles 421 and 422 having different electric charges and colors (hue).

In the electrophoretic display unit 200, when a selection signal (selection voltage) is supplied to at least one scanning line 302, the thin-film transistor 1 connected to the scanning line 302 to which the selection signal (selection voltage) is supplied becomes the ON state. Accordingly, the data line 301 connected to the thin-film transistor 1 is substantially electrically connected to the pixel electrode 401. In this case, when the electrophoretic display unit 200 is in a state in which a desired data (voltage) is supplied to the data line 301, the data (voltage) is supplied to the pixel electrode 401. Accordingly, an electric field is generated between the pixel electrode 401 and the transparent electrode 403. The electrophoretic particles 421 and 422 are subjected to electrophoresis in a direction of either electrode in accordance with the direction and intensity of the electric field, characteristics of the electrophoretic particles 421 and 422, and the like.

On the other hand, when the supply of the selection signal (selection voltage) to the scanning line 302 is stopped in this state, the thin-film transistor 1 becomes the OFF state. Accordingly, the data line 301 connected to the thin-film transistor 1 is not electrically connected to the pixel electrode 401. Thus, supply and termination of supply of a selection signal to the scanning line 302 or supply and termination of supply of data to the data line 301 are performed in appropriate combinations, thereby displaying a desired image (information) on the side of a display surface (the side of the transparent substrate 404) of the electrophoretic display unit 200.

In particular, according to the electrophoretic display unit 200 of this embodiment, since the colors of the electrophoretic particles 421 and 422 are different from each other, multiple-tone images can be displayed. Furthermore, the electrophoretic display unit 200 of this embodiment includes the active matrix device 300, and thus the thin-film transistor 1 connected to a specific scanning line 302 can be selectively controlled to the ON or OFF state. Accordingly, the problem of cross talk does not easily occur and the speed of circuit operation can be increased, thus producing an image (information) with high quality. Furthermore, since the electrophoretic display unit 200 of this embodiment operates at a low drive voltage, electrical power can be saved. The application of the display unit of the invention is not limited to such an electrophoretic display unit 200. The display unit of the invention can also be applied to a liquid crystal display unit, an organic or inorganic EL display unit, and the like.

Electronic Device

The above-described electrophoretic display unit 200 can be installed in various electronic devices. An electronic device of the invention including the electrophoretic display unit 200 will now be described.

Electronic Paper

Figure 7:
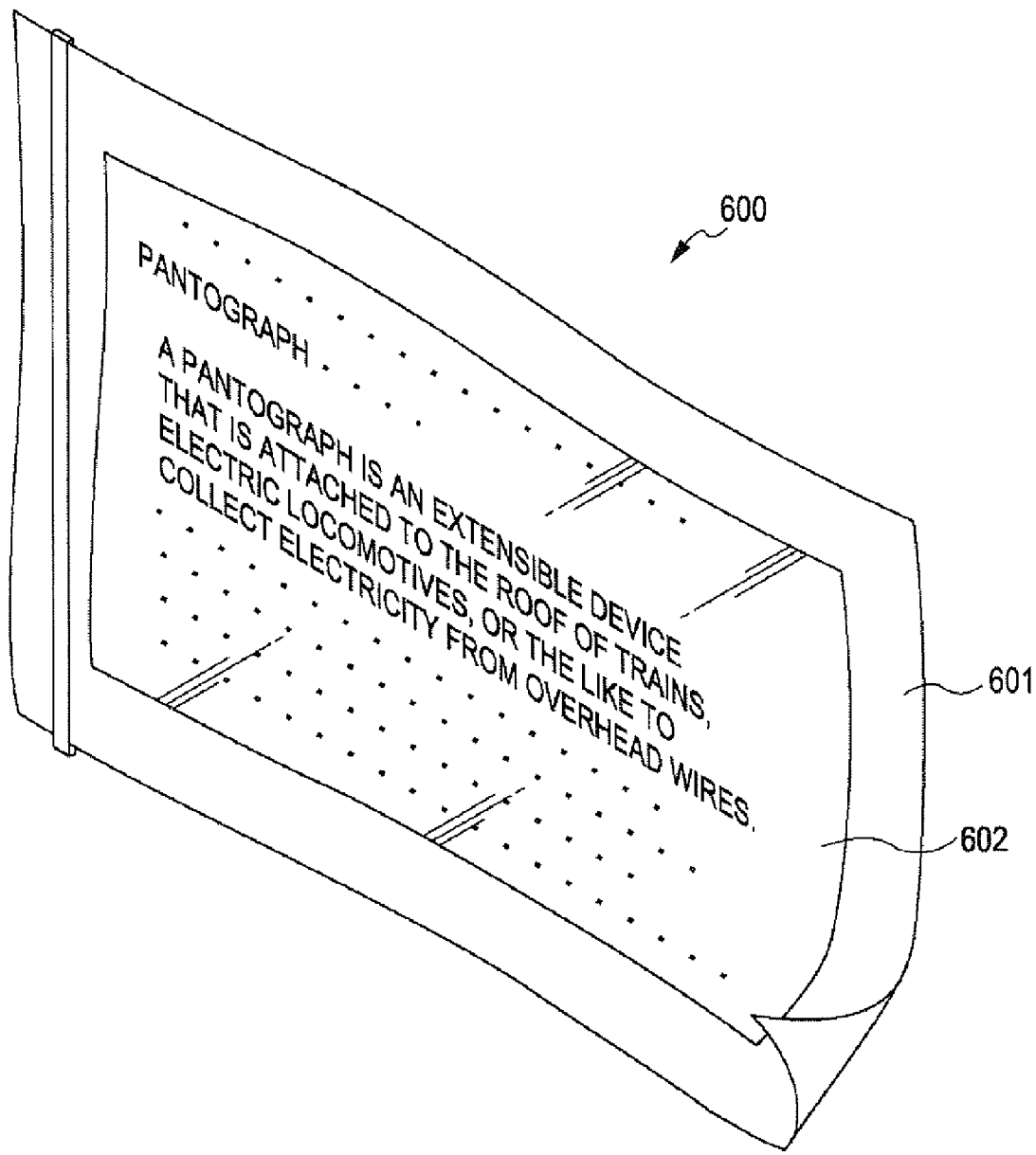
FIG. 7 is a perspective view showing electronic paper to which an electronic device of the invention is applied according to an embodiment of the invention.

An embodiment in the case where an electronic device of the invention is applied to electronic paper will now be described. FIG. 7 is a perspective view showing electronic paper to which the electronic device of the invention is applied according to an embodiment of the invention. Electronic paper 600 shown in the figure includes a main body 601 composed of a rewritable sheet having a texture and flexibility similar to those of paper, and a display unit 602. in the electronic paper 600, the display unit 602 is composed of the above-described electrophoretic display unit 200.

Display

Figure 8A:
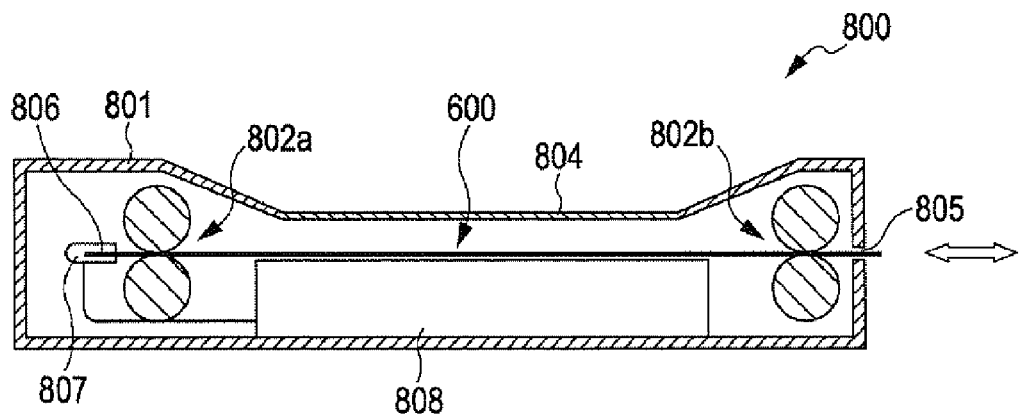
FIGS. 8A and 8B are views showing a display to which an electronic device of the invention is applied according to an embodiment of the invention.
Figure 8B:
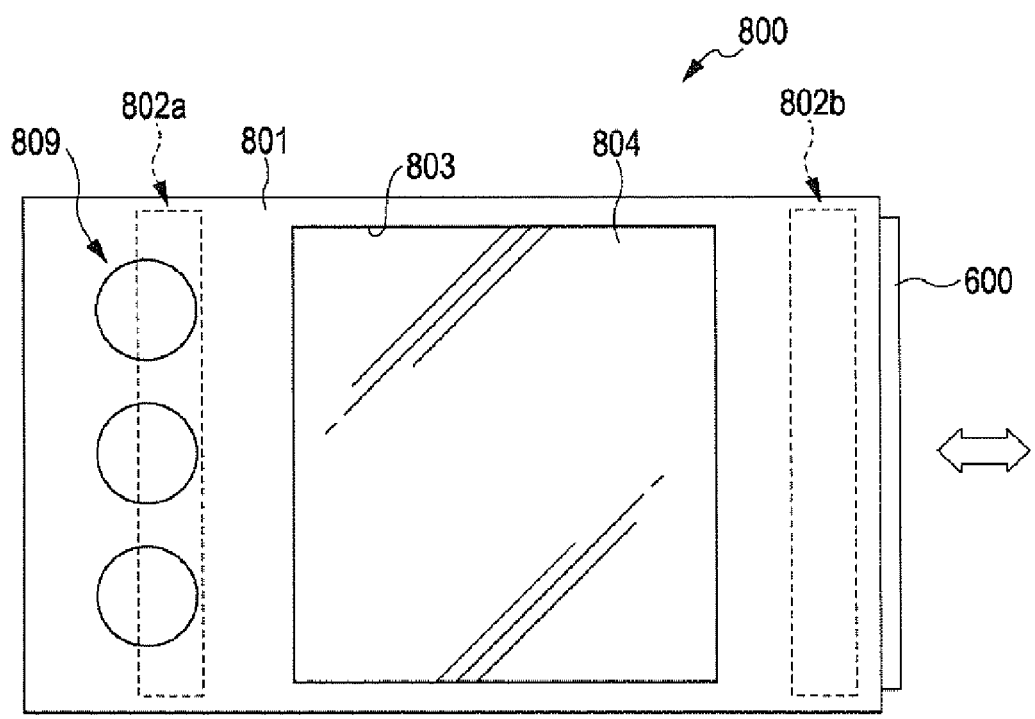

An embodiment in the case where the electronic device of the invention is applied to a display will now be described. FIGS. 8A and 8B are views showing a display to which the electronic device of the invention is applied according to an embodiment of the invention. FIG. 8A is a cross-sectional view of the display and FIG. 8B is a plan view thereof. A display 800 shown in the figures includes a main body 801 and removable electronic paper 600 provided in the main body 801. This electronic paper 600 has the same structure as that shown in FIG. 7.

The main body 801 includes an inlet 805 provided in a side portion thereof (on the right side in the figures), and two pairs of feed rollers 802a and 802b provided inside thereof. The electronic paper 600 can be inserted from the inlet 805. When the electronic paper 600 is inserted into the main body 801 through the inlet 805, the electronic paper 600 is attached to the main body 801 in a state where the electronic paper 600 is held by the pairs of feed rollers 802a and 802b therebetween.

The main body 801 further includes a rectangular opening 803 provided on the display surface side thereof (on the near side of the drawing sheet of FIG. 8B). A transparent glass panel 804 is fitted in the opening 803. This structure allows the electronic paper 600 attached to the main body 801 to be visible from the outside of the main body 801. That is, according to this display 800, the electronic paper 600 attached to the main body 801 is visually identified through the transparent glass panel 804, thereby forming the display surface.

The electronic paper 600 includes a terminal section 806 provided in a leading end in the insert direction of the electronic paper 600 (on the left side of the figures). A socket 807 is provided inside the main body 801. The terminal section 806 is connected to the socket 807 in a state where the electronic paper 600 is attached to the main body 801. A controller 808 and an operating section 809 are electrically connected to the socket 807. In the display 800, the electronic paper 600 is removably attached to the main body 801. Therefore, the electronic paper 600 can be detached from the main body 801 and carried for use. In this display 800, the electronic paper 600 is composed of the electrophoretic display unit 200 described above.

The application of the electronic device of the invention is not limited to the above. Examples of the application include a television, viewfinder-type and direct-monitoring-type video tape recorders, a car navigation system, a pager, an electronic notebook, an electronic calculator, an electronic newspaper, a word processor, a personal computer, a workstation, a picture telephone, a POS terminal, and a device with a touch panel. The electrophoretic display unit 200 can be applied to the display sections of these electronic devices.

While the thin-film transistor, the electronic circuit, the display unit, and the electronic device of the invention have been described, the invention is not limited to these. For example, the structures of each part of the thin-film transistor, the electronic circuit, the display unit, and the electronic device of the invention can be replaced with any structure that can exhibit similar functions, or any structure may be added thereto.

EXAMPLES

Specific examples of the invention will now be described. Table 1 shows specific insulating inorganic particles, hydrophobic compounds, the types of insulating polymer, and the contents of composite particles etc. that are used in examples described below.

1. Production of Thin-film Transistors

Example 1

First, a glass substrate was prepared and washed with ethanol to perform degreasing of the surface thereof. Gold was evaporated on the glass substrate to form a Au evaporated film.

A source electrode and a drain electrode were then formed on the Au evaporated film by photolithography. Thus, the source electrode and the drain electrode were obtained. Subsequently, an oxygen plasma treatment was performed on the Au evaporated film. Subsequently, a solution of an organic semiconductor material having a thiophene group was applied on the substrate by spin coating and then dried to form an organic semiconductor layer. In Example 1, silica ($SiO_2$) particles having an average particle diameter of 15 nm were used as insulating inorganic particles, a silane coupling agent ($C_{17}F_{35}CH_2Si(OC_2H_5)_3$) was used as a hydrophobic compound, and polymethylmethacrylate was used as an insulating polymer. These components were used in the ratios shown in Table 1. Thus, a gate insulating layer was formed on the organic semiconductor layer.

More specifically, the gate insulating layer was formed as follows. First, the silane coupling agent ($C_{17}F_{35}CH_2Si$ ($OC_2H_5)_3$) was dissolved in toluene to prepare a 10 weight percent hydrophobic compound toluene solution. This hydrophobic compound toluene solution was added to a nanosilica-particle toluene dispersion liquid prepared by dispersing the $SiO_2$ particles in toluene. The mixture was then stirred while ultrasonic waves were applied to prepare a liquid material.

A hydroxyl group is present on the nano-level surface of the silica ($SiO_2$) particle in the form of a Si—OH structure. The silane coupling agent includes ethoxy groups as hydrolyzable groups and a perfluoro group as a hydrophobic group. Aromatic solvents such as toluene, benzene, xylenes, and mesitylene can be used as the dispersion medium and the solvent for preparing the liquid material. In this example, toluene was used as the preferred dispersion medium and solvent.

The application of ultrasonic waves to the liquid material may be omitted. The resulting liquid material was then left to stand for about 24 hours. Accordingly, the ethoxy groups, which are hydrolyzable groups of the hydrophobic compound, were reacted with the Si—OH structures (silanol groups) disposed on the surfaces of the $SiO_2$ particles to prepare silica composite particles (composite particles) in which a coating layer composed of the hydrophobic compound was provided on the surfaces of the $SiO_2$ particles (insulating inorganic particles). A chemical reaction represented by chemical formula 2 is conducted on the surfaces of the $SiO_2$ particles, thereby producing the silica composite particles.

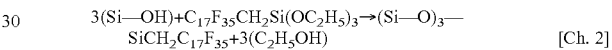

$$3(Si-OH)+C_{17}F_{35}CH_2Si(OC_2H_5)_3 \rightarrow (Si-O)_3-SiCH_2C_{17}F_{35}+3(C_2H_5OH) \quad [Ch. 2]$$

The resulting composite particles were fed (added) to a solution of polymethylmethacrylate, and the mixture was then stirred while ultrasonic waves were applied. Thus, a liquid material for forming a gate insulating layer was prepared. In the liquid material, the ratio represented by composite particles:polymethylmethacrylate was 1:9 (weight ratio), and the ratio of the solid component to the liquid component was 5 wt/vol %. In the material for forming a gate insulating layer, the viscosity was 3 mP·s and the water content was 0.5% or less. Aromatic solvents can be used as the dispersion medium for preparing the material for forming a gate insulating layer as in the above case. In this example, toluene was used as the preferred dispersion medium.

Next, the material for forming a gate insulating layer was applied on the organic semiconductor layer by spin coating and then dried. Accordingly, the gate insulating layer having an average thickness of 1,000 nm was formed. Subsequently, a colloidal dispersion liquid of Ag was applied by an ink-jetting method at an area on the gate insulating layer, the area corresponding to the area between the source electrode and the drain electrode, and then dried. Thus, a gate electrode having an average thickness of 1 µm was formed. A thin-film transistor was produced by the above process.

Example 2

A thin-film transistor was produced as in Example 1, except that the silica composite particles and polymethylmethacrylate were mixed in a ratio of 1:4 (weight ratio)

Example 3

A thin-film transistor was produced as in Example 1, except that the silica composite particles and polymethylmethacrylate were mixed in a ratio of 1:3 (weight ratio).

Example 4

A thin-film transistor was produced as in Example 1, except that the silica composite particles and polymethylmethacrylate were mixed in a ratio of 2:3 (weight ratio).

Example 5

A thin-film transistor was produced as in Example 1, except that the silica composite particles and polymethylmethacrylate were mixed in a ratio of 1:1 (weight ratio).

Example 6

A thin-film transistor was produced as in Example 1, except that the silica composite particles and polymethylmethacrylate were mixed in a ratio of 3:1 (weight ratio).

Example 7

A thin-film transistor was produced as in Example 1, except that polymethylmethacrylate was omitted.

Example 8

A thin-film transistor was produced as in Example 3, except that $C_{18}H_{37}Si(OC_2H_5)_3$ was used as the hydrophobic compound.

Example 9

A thin-film transistor was produced as in Example 3, except that $NH_2(CH_2)_3Si(OC_2H_5)_3$ was used as the hydrophobic compound.

Example 10

A thin-film transistor was produced as in Example 3, except that silica particles that were not subjected to the surface treatment were used instead of the silica composite particles.

Example 11

A thin-film transistor was produced as in Example 5, except that barium titanate composite particles were used instead of the silica composite particles.

Example 12

A thin-film transistor was produced as in Example 11, except that barium titanate particles that were not subjected to the surface treatment were used instead of the barium titanate composite particles.

Example 13

A thin-film transistor was produced as in Example 1, except that the gate insulating layer was formed as follows.

First, a methacryloxysilane (methacryloxypropyltrimethoxysilane) represented by chemical formula 1 was dissolved in toluene to prepare a 10 weight percent methacryloxysilane toluene solution. This methacryloxysilane toluene solution was added to a nanosilica-particle toluene solution prepared by dispersing $SiO_2$ particles having an average particle diameter of 15 nm in toluene. The mixture was then stirred while ultrasonic waves were applied to prepare a methacryloxysilane-modified nanosilica dispersion liquid.

Methyl methacrylate was dissolved in toluene to prepare a toluene solution of methyl methacrylate. This toluene solution of methyl methacrylate was added to the methacryloxysilane-modified nanosilica dispersion liquid so that the ratio represented by composite particles:polymethylmethacrylate was 1:9 (weight ratio) and the ratio of the solid component to the liquid component was 5 wt/vol %, and the mixture was then stirred. Subsequently, an excessive amount of toluene was distilled off from the dispersion liquid after stirring using, for example, an evaporator in which pressure reduction and heating can be performed.

Next, benzoyl peroxide was added to the dispersion liquid whose excessive amount of toluene had been distilled off. The dispersion liquid was stirred at 45° C. for 48 hours and then left to stand in an atmosphere at 80° C. and 23.4 kPa for 72 hours. Thus, a methacryloxysilane-modified nanosilica/acrylate-containing material for forming a gate insulating layer was prepared. This material for forming a gate insulating layer was then applied on the organic semiconductor layer by spin coating and then dried. Accordingly, the gate insulating layer having an average thickness of 1,000 nm was formed.

Example 14

A thin-film transistor was produced as in Example 13, except that the silica composite particles and polymethylmethacrylate were mixed in a ratio of 1:4 (weight ratio).

Example 15

A thin-film transistor was produced as in Example 13, except that the silica composite particles and polymethylmethacrylate were mixed in a ratio of 1:3 (weight ratio).

Example 16

A thin-film transistor was produced as in Example 13, except that the silica composite particles and polymethylmethacrylate were mixed in a ratio of 2:3 (weight ratio).

Comparative Example

A thin-film transistor was produced as in Example 1, except that the gate insulating layer was formed by applying a solution of polymethylmethacrylate by spin coating and then drying the solution.

2. Evaluations

2-1. Measurement of Withstand Voltage Characteristic

The withstand voltage characteristic of each gate insulating layer prepared in the examples and the comparative example was measured.

2-2. Measurement of Threshold Voltage Vth

The threshold voltage Vth of each thin-film transistor prepared in the examples and the comparative example was measured. This measurement was performed with a "semiconductor Parameter Analyzer 4156C" manufactured by Agilent Technologies. Herein, the threshold voltage Vth means a gate voltage at which a value of an approximate expression (relational expression) representing the relationship between the gate voltage and $Id^{1/2}$ (Id: a value of drain current) is zero. This threshold voltage Vth is considered to be a gate voltage required for starting the flow of the drain current. The results are shown in Table 1.

TABLE 1

| | Gate insulating layer | | | | Threshold | | |
|---|---|---|---|---|---|---|---|
| | Composite particles | | | | Withstand voltage (MV/cm) | voltage Vth (V) | Relative dielectric constant |
| | Insulating inorganic particles | Hydrophobic compound | Content [wt %] | Insulating polymer | | | |
| Example 1 | Silica | $C_{17}F_{35}CH_2Si(OC_2H_5)_3$ | 10 | Polymethylmethacrylate | 2.1 | 9 | 3.7 |
| Example 2 | Silica | $C_{17}F_{35}CH_2Si(OC_2H_5)_3$ | 20 | Polymethylmethacrylate | 2.3 | 10 | 3.7 |
| Example 3 | Silica | $C_{17}F_{35}CH_2Si(OC_2H_5)_3$ | 25 | Polymethylmethacrylate | 2.5 | 12 | 3.7 |
| Example 4 | Silica | $C_{17}F_{35}CH_2Si(OC_2H_5)_3$ | 40 | Polymethylmethacrylate | 2.5 | 14 | 3.7 |
| Example 5 | Silica | $C_{17}F_{35}CH_2Si(OC_2H_5)_3$ | 50 | Polymethylmethacrylate | 2.5 | 15 | 3.8 |
| Example 6 | Silica | $C_{17}F_{35}CH_2Si(OC_2H_5)_3$ | 75 | Polymethylmethacrylate | 2.5 | 18 | 3.8 |
| Example 7 | Silica | $C_{17}F_{35}CH_2Si(OC_2H_5)_3$ | 100 | — | 2.2 | 20 | 3.9 |
| Example 8 | Silica | $C_{18}H_{37}Si(OC_2H_5)_3$ | 25 | Polymethylmethacrylate | 2.2 | 2 | 3.7 |
| Example 9 | Silica | $NH_2(CH_2)_3Si(OC_2H_5)_3$ | 25 | Polymethylmethacrylate | 2.2 | −3 | 3.7 |
| Example 10 | Silica | — | 25 | Polymethylmethacrylate | 2.5 | −18 | 3.7 |
| Example 11 | Barium titanate | $C_{17}F_{35}CH_2Si(OC_2H_5)_3$ | 50 | Polymethylmethacrylate | 2.5 | 12 | 75 |
| Example 12 | Barium titanate | — | 50 | Polymethylmethacrylate | 2.5 | −16 | 75 |
| Example 13 | Silica | $CH_2=C(CH_3)(COO)(CH_2)_3Si(OC_2H_5)_3$ | 10 | Polymethylmethacrylate | 2.3 | −1 | 3.7 |
| Example 14 | Silica | $CH_2=C(CH_3)(COO)(CH_2)_3Si(OC_2H_5)_3$ | 20 | Polymethylmethacrylate | 2.5 | 2 | 3.7 |
| Example 15 | Silica | $CH_2=C(CH_3)(COO)(CH_2)_3Si(OC_2H_5)_3$ | 25 | Polymethylmethacrylate | 2.6 | 2 | 3.7 |
| Example 16 | Silica | $CH_2=C(CH_3)(COO)(CH_2)_3Si(OC_2H_5)_3$ | 40 | Polymethylmethacrylate | 2.6 | 3 | 3.8 |
| Comparative Example | | | | Polymethylmethacrylate | 2.0 | −4 | 3.6 |

As shown in Table 1, the withstand voltage characteristics of the thin-film transistors of the examples were higher than that of the thin-film transistor of the comparative example. The threshold voltage Vth could also be controlled in the thin-film transistors of the examples. These results showed that, by adding insulating inorganic particles to the gate insulating layer, the withstand voltage characteristic could be improved without impairing the transistor characteristic. When insulating inorganic particles that were subjected to a surface treatment were used, the withstand voltage characteristic and the transistor characteristic, in particular, the threshold voltage value tended to improve. In addition, the thin-film transistors having the structures shown in FIGS. 3 and 4 were produced and evaluated in the same way. Consequently, the same results were obtained.

What is claimed is:

1. A thin-film transistor comprising:
   a semiconductor layer;
   a gate electrode; and
   a gate insulating layer disposed between the semiconductor layer and the gate electrode, the gate insulating layer including an insulating polymer and a plurality of particles dispersed in the insulating polymer,
   wherein at least one of the plurality of particles includes an inorganic insulating particle and a hydrophobic compound provided on a surface of the inorganic insulating particle.

2. The thin-film transistor according to claim 1, wherein the semiconductor layer is primarily composed of an organic semiconductor material.

3. The thin-film transistor according to claim 1, wherein the hydrophobic compound is a coupling agent having a hydrophobic structure.

4. The thin-film transistor according to claim 1, wherein the hydrophobic compound has a reactive group that can be reacted with the insulating polymer.

5. The thin-film transistor according to claim 1, wherein the hydrophobic compound is at least one of a silane coupling agent, a titanate coupling agent, an organic phosphoric acid coupling agent, and a silyl peroxide coupling agent.

6. The thin-film transistor according to claim 1, wherein an inorganic element included in the hydrophobic compound is the same as an inorganic element that is contained in the one of the plurality of particles.

7. The thin-film transistor according to claim 1, wherein the insulating inorganic particles have a granular or acicular shape.

8. The thin-film transistor according to claim 1, wherein the one of the plurality of particles is primarily composed of an inorganic oxide.

9. The thin-film transistor according to claim 1, wherein the inorganic oxide is at least one selected from silicon oxide, aluminum oxide, zirconium oxide, cerium oxide, zinc oxide, cobalt oxide, lead zirconate titanate, lead titanate, titanium oxide, and tantalum oxide.

10. The thin-film transistor according to claim 1, wherein the plurality of particles have an average particle diameter in the range of 5 to 30 nm.

11. The thin-film transistor according to claim 1, wherein the content of the plurality of particles in the gate insulating layer is 15 weight percent or more.

12. The thin-film transistor according to claim 1, wherein the insulating polymer includes polymethylmethacrylate as a main component.

13. An electronic circuit comprising the thin-film transistor according to claim 1.

14. A display unit comprising the electronic circuit according to claim 13.

15. An electronic device comprising the display unit according to claim 14.

* * * * *